United States Patent
Haulick et al.

(10) Patent No.: US 8,098,848 B2
(45) Date of Patent: Jan. 17, 2012

(54) SYSTEM FOR EQUALIZING AN ACOUSTIC SIGNAL

(75) Inventors: Tim Haulick, Blaubeuren (DE);
Gerhard Uwe Schmidt, Ulm (DE);
Markus Buck, Biberach (DE)

(73) Assignee: Nuance Communications, Inc.,
Burlington, MA (US)

( * ) Notice: Subject to any disclaimer, the term of this patent is extended or adjusted under 35 U.S.C. 154(b) by 1249 days.

(21) Appl. No.: 11/749,678

(22) Filed: May 16, 2007

(65) Prior Publication Data
US 2008/0031471 A1 Feb. 7, 2008

(30) Foreign Application Priority Data
May 19, 2006 (EP) .................................... 06010399

(51) Int. Cl.
*H03G 5/00* (2006.01)
(52) U.S. Cl. .............. 381/103; 381/83; 381/93; 381/66; 379/406.08
(58) Field of Classification Search .............. 381/86, 381/103, 83, 98, 93, 66; 379/406.01, 406.05–406.06, 379/406.08–406.09
See application file for complete search history.

(56) References Cited

U.S. PATENT DOCUMENTS

| | | | | |
|---|---|---|---|---|
| 5,768,398 A | * | 6/1998 | Janse et al. | 381/103 |
| 6,744,887 B1 | * | 6/2004 | Berstein et al. | 379/406.08 |
| 6,895,094 B1 | * | 5/2005 | Scalart et al. | 381/66 |
| 7,006,624 B1 | | 2/2006 | Philipsson et al. | |
| 2003/0108209 A1 | | 6/2003 | McIntosh | |
| 2005/0244012 A1 | * | 11/2005 | Asada | 381/56 |
| 2005/0265560 A1 | * | 12/2005 | Haulick et al. | 381/58 |

OTHER PUBLICATIONS

Breining, Christina et al., "Acoustic Echo Control, An Application of Very-High-Order Adaptive Filters", IEEE Signal Processing Magazine, vol. 16, No. 4, Jul. 1999, pp. 42-69.

Glentis, George-Othon et al., "Efficient Least Squares Adaptive Algorithms for FIR Transversal Filtering", IEEE Signal Processing Magazine; Jul. 1999, pp. 13-41.

* cited by examiner

*Primary Examiner* — Devona Faulk
*Assistant Examiner* — Disler Paul
(74) *Attorney, Agent, or Firm* — Sunstein Kann Murphy & Timbers LLP

(57) ABSTRACT

An equalization system enhances the quality of communications between a remote party and a local party. The equalization system includes an equalization filter that equalizes an acoustic signal received from the remote party. The equalized acoustic signal is transmitted to a speaker based on the equalized acoustic signal. A device converts sound into electrical signals. The electrical signals are transmitted to an echo compensation filter that compensates for reflected sound. Filter characteristics of the equalization filter are based on filter characteristics of the echo compensation filter.

26 Claims, 8 Drawing Sheets

US 8,098,848 B2

SYSTEM FOR EQUALIZING AN ACOUSTIC SIGNAL

PRIORITY CLAIM

This application claims the benefit of priority from European Patent Application No. 06010399.1, filed May 19, 2006, which is incorporated by reference.

BACKGROUND OF THE INVENTION

1. Technical Field

The present invention relates to acoustic signal processing and, in particular, to equalizing acoustic signals.

2. Related Art

Communication between parties may be carried out in a noisy environment. Noise reduction may improve speech intelligibility in vehicle communication systems.

The reverberation characteristics of an enclosure may create a problem with some systems. The acoustics of an enclosure may change due to movements of vehicle occupants, opening and closing vehicle windows, or other changes to the characteristics of the enclosure. These changes make it difficult to detect a decreased sound.

Despite improvements, the quality of acoustic signals may be noticeably distorted and deteriorated by noise and echo components. Therefore, a need exists for a system that exhibits efficient acoustic echo compensation and improves equalization of sound.

SUMMARY

An equalization system enhances the quality of communications between a remote party and a local party. The equalization system includes an equalization filter that equalizes an acoustic signal received from the remote party. The equalized acoustic signal is transmitted to a speaker based on the equalized acoustic signal. A device converts sound into electrical signals. The electrical signals are transmitted to an echo compensation filter that compensates for reflected sound. Filter characteristics of the equalization filter are based on filter characteristics of the echo compensation filter.

Other systems, methods, features, and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
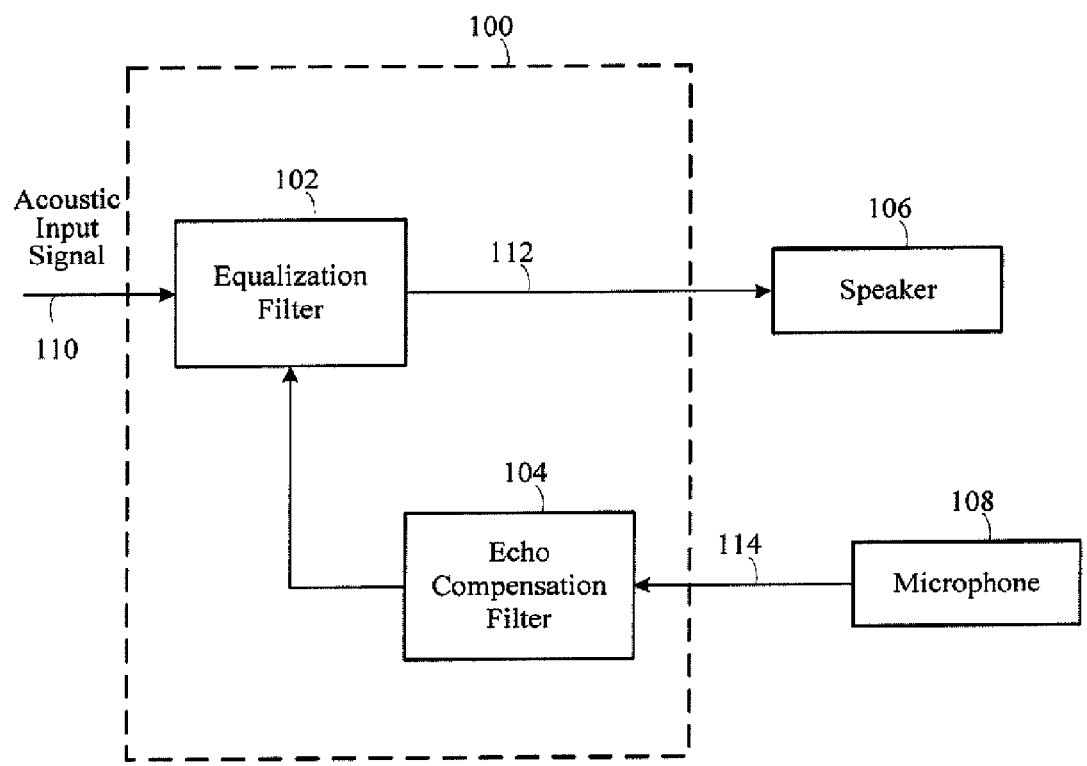
FIG. 1 is an exemplary equalization system.

FIG. 1 is an exemplary equalization system 100. The system 100 includes an equalization filter 102 in communication with an echo compensation filter 104. In FIG. 1, the equalization filter 102 is in communication with a speaker 106 and the echo compensation filter 104 is in communication with a microphone 108.

The equalization filter 102 may receive an acoustic input signal 110. The acoustic input signal 110 may be received from a remote party through a telephone or other communication media. In some applications the acoustic input signal 110 includes some or all of the voiced and unvoiced speech received from the remote party. The communication from the remote party may include one, two, or more acoustic input signals 110.

The equalization filter 102 processes the acoustic input signal 110 to generate an equalized acoustic input signal 112. The equalization filter 102 may process the acoustic input signal 110 by amplifying or attenuating portions of the signal 110 over a predetermined frequency range. The equalization filter 102 may include a shelving filter for selectively boosting or attenuating the low or high frequency range. The equalization filter 102 may also comprise a peaking filter that boosts or attenuates signals with a center frequency, where bandwidth in-band and out-band gains may be separately adjustable. The equalization filter 102 may include a parametric equalizer that combines one or more shelving filters and or peaking filters.

The speaker 106 converts the equalized acoustic input signal 112 into audible sound. A device that converts sound into analog or digital signals such as a microphone 108 may detect the speaker 106 output. The analog or digital signal 114 may compensate for reflected sound though an echo compensation filter 104.

The echo compensation filter 104 includes a filter characteristic that may be based on echo compensation filter coefficients. The filter characteristic of the equalization filter 102 may be based on selected or all of the characteristics of the echo compensation filter 104. When filter coefficients are used, the equalization filter coefficients may be based on the echo compensation filter coefficients. The filter coefficients may be adaptable.

Figure 2:
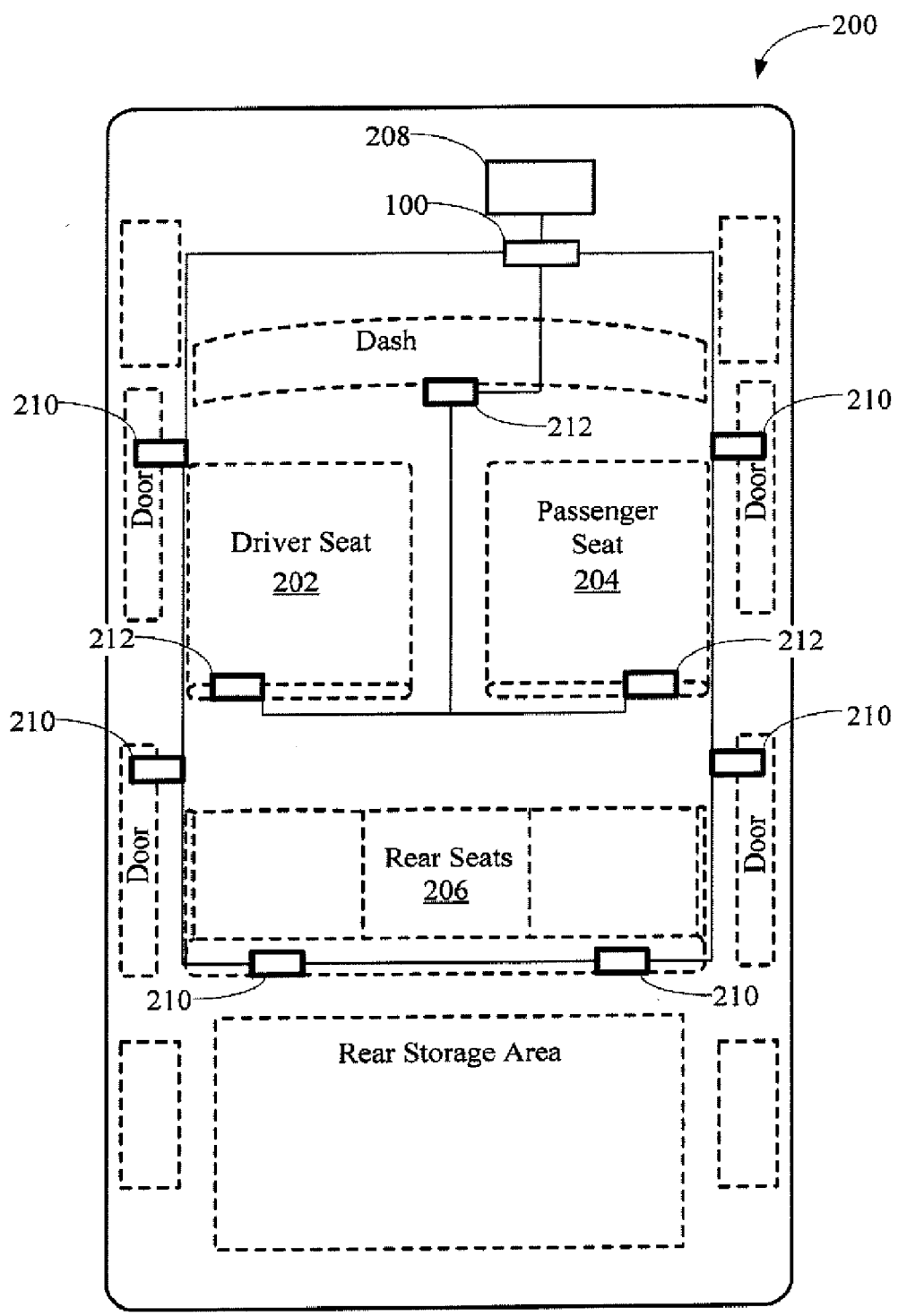
FIG. 2 shows the equalization system of FIG. 1 incorporated into a vehicle.

FIG. 2 shows the equalization system 100 of FIG. 1 incorporated into a vehicle 200. The vehicle 200 includes a driver seat 202, a passenger seat 204, and one or more rear seats 206. A local party located in, for example, the passenger seat 204, may communicate with a remote party. The remote party 206 may be communicating with the local party 204 through a hands-free communication device integrated within the vehicle.

The vehicle 200 includes one or more speakers 210 or other sound transmitting devices that convert electrical signals into audio sound. The vehicle 200 also includes one or more devices that convert sound waves into electrical signals such as a microphone 212. FIG. 2 shows speakers 210 located at the vehicle doors and behind the rear seats 206 and microphones 212 located in headrests of the drivers and passenger seats 202, 204 and in the dashboard of the vehicle. The speakers 210 and microphones 212 may be positioned at different locations throughout the vehicle 200.

The equalization system 100 may be in communication with or may be a part of an on-board computer 208 of the vehicle 200. In alternative systems the equalization system 100 may be part of an electronic control unit, a body control module, or another in-vehicle computer system. In some other systems, the equalization system 100 may be a separate after-factory unit in communication with vehicle 200 circuitry.

The equalization system 100 equalizes acoustic input signals received from the remote party. The speakers 210 may receive and output the equalized acoustic signals. The microphones 212 may detect the equalized signals output by the speakers and may generate signals based on the detected equalized signals. The microphones may be part of a microphone array comprising a directional microphone. The signals to be echo compensated may be beamformed by a beamformer that improves signal quality by selecting certain signals of a multi-channel approach.

The echo compensation filter compensates for the undesired effects of a reflected signal in input signals. A first acoustic input signals received from the remote party at the beginning of, for example, a hand-free telephone conversation may be used to initialize the echo compensation filter and thereby initialize the equalization filter.

After the initialization, the equalization system 100 may facilitate communication between the remote party and the passenger through an improved intelligibility achieved through the echo compensation and signal equalization. In some systems, signal equalization is performed by determining equalization filter coefficients based on the filter coefficients of the echo compensation filter.

The echo compensation filter may be an adaptive filter. In passenger compartment in which microphones 212 and speakers 210 are installed for communication with a remote party, the equalization system 100 may account for dynamic changes caused by, for example, the movement of passengers or opening and closing of windows by automatically and dynamically adjusting the filter coefficients of the echo compensation filter. Using an adaptive echo compensation filter the system 100 can react to dynamic changes in a transfer function describing the overall transfer from the acoustic input signal via the speakers 210 and the enclosure to the microphones 212.

A passenger in the front cabin of the vehicle 200 may represent the remote party and a passenger in the rear seats 206 may represent the local party, or vice versa. The remote party may not necessarily be remote from the vehicle 200. For example, the vehicle 200 may include microphones 212 and speakers 210 in the front and rear of the vehicle 200 to facilitate communication between rear and forward passengers of a vehicle through the use of microphones 212 and speakers 210 located in the front and rear portions of the vehicle 200.

Figure 3:
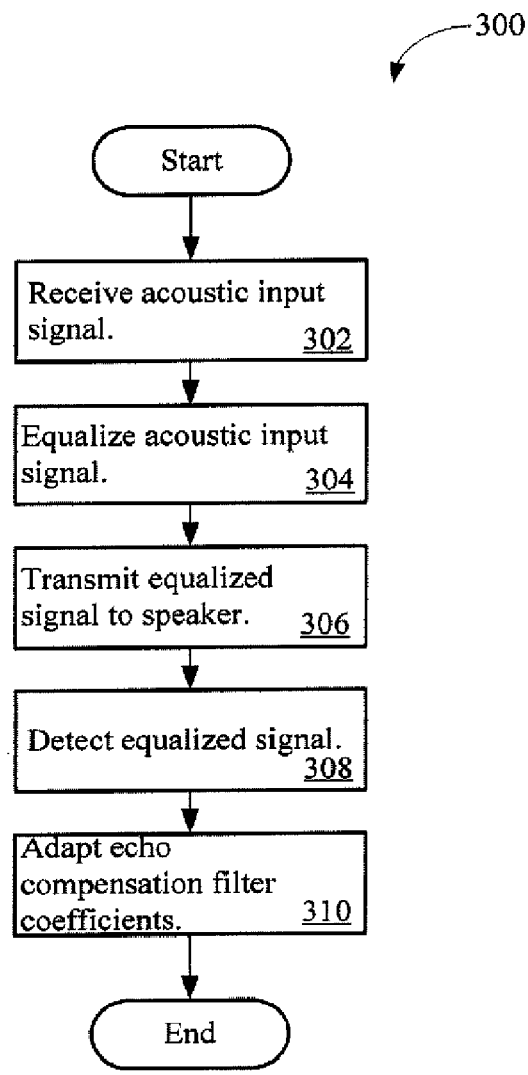
FIG. 3 is an exemplary process by which an acoustic signal may be equalized.

FIG. 3 is an exemplary process 300 by which an acoustic signal may be equalized. The process 300 receives an acoustic input signal (Act 302). The acoustic input signal may be a signal received from a remote party. The process 300 equalizes the acoustic input signal to produce an equalized acoustic input signal (Act 304). The equalization of the acoustic input signal may include boosting or attenuating the acoustic input signal over a pre-determined frequency. The process 300 may selectively boost or attenuate low, high, or other frequency ranges. The process 300 may boost or attenuate an acoustic input signal with a center frequency. Bandwidth in-band and out-band gains may be separately adjustable.

The process 300 may apply the acoustic input signal to an equalization filter comprising multiple equalization filter coefficients. The equalization filter coefficients, $h_C(n)=[h_{C,0}(n), h_{C,1}(n), \ldots, h_{C,N_C-1}(n)]^T$, where the upper index T denotes the transposition operation and n is a discrete time index, are employed to enhance the quality of the acoustic input signal.

The equalization filter coefficients may be determined from echo compensation filter coefficients, $\hat{h}_{LR}(n)=[\hat{h}_{LR,0}(n), \hat{h}_{LR,1}(n), \ldots, \hat{h}_{LR,N-1}(n)]^T$, of an echo compensation filter. Narrow band drops or raises may be ignored by the equalization filtering process 300. In addition, the equalization filter may modify the spectral envelope of the acoustic input signal.

The equalization filter coefficients may be calculated from the echo compensation filter coefficients as follows. The $N_C+1$ coefficients, $$r_i(n) = \frac{1}{N-1} \sum_{k=0}^{N-i-1} \hat{h}_{LR,k}(n)\hat{h}_{LR,k+i}(n),$$

of the vector $r(n)=[r_0(n), r_1(n), \ldots, r_{N_C}(n)]^T$ are calculated. This calculation may be performed periodically, such as several times per second. In addition, the length $N_C$ of the equalization filter may be represented by the number of equalization filter coefficients. The number of equalization filter coefficients may be may be, for example, less than 20, between 10 and 20, or another number of coefficients. The length of the echo compensation filter may be chosen as, for example, N=256. The equalization filter coefficients may be determined by solving the linear equation system:

$$\begin{bmatrix} r_0(n) & r_1(n) & \cdots & r_{N_C-1}(n) \\ r_1(n) & r_0(n) & \cdots & r_{N_C-2}(n) \\ \vdots & \vdots & \ddots & \vdots \\ r_{N_C-1}(n) & r_{N_C-2}(n) & \cdots & r_0(n) \end{bmatrix} \begin{bmatrix} h_{C,0}(n) \\ h_{C,1}(n) \\ \vdots \\ h_{C,N_C-1}(n) \end{bmatrix} = \begin{bmatrix} r_1(n) \\ r_2(n) \\ \vdots \\ r_{N_C}(n) \end{bmatrix},$$

the solution of which may be calculated with a Levinson-Durbin or other recursive method. The calculated solution may be phase minimal. In other words, the signal travel time introduced by filtering logic is minimized.

Based on the equalization filter coefficients determined based on the echo compensation filter coefficients, the process 300 equalizes the acoustic input signal The process 300 may transmit the equalized acoustic signal to a speaker or other sound emitting device that generates an audio signal to be heard by a user (Act 306). A microphone may detect the audio signal generated by the speaker and generate a microphone signal based on the detected audio signal. The process 300 receives a microphone signal and apply the microphone signal to the echo compensation filter (Act 308).

The process 300 adapts the echo compensation filter coefficients based on the detected audio signal (Act 310). The echo compensation filter may be an adaptive finite impulse response (FIR filter). The echo compensation filter may comprise other filter types, such as an infinite impulse response filter (IIR filter). The filter coefficients of the echo compensation filter may be adapted by a normalized least mean square (NMLS) method or other adaptive method. The process 300 may adapt the echo compensation filter coefficients based on a beamformed microphone signal if, for example, the microphone is a directional microphone. Echo compensation of the microphone may include linear prediction coding (LPC) filtering.

The process 300 accordingly enhances the acoustic signal generated from the remote party and heard by a local party. The process 300 may adapt the equalization filter coefficients based on the adapted echo compensation filter coefficients. In determining the equalization filter coefficients based on the echo compensation filter coefficients, the process 300 accordingly enhances the acoustic signal generated from the remote party and heard by a local party.

Figure 4:
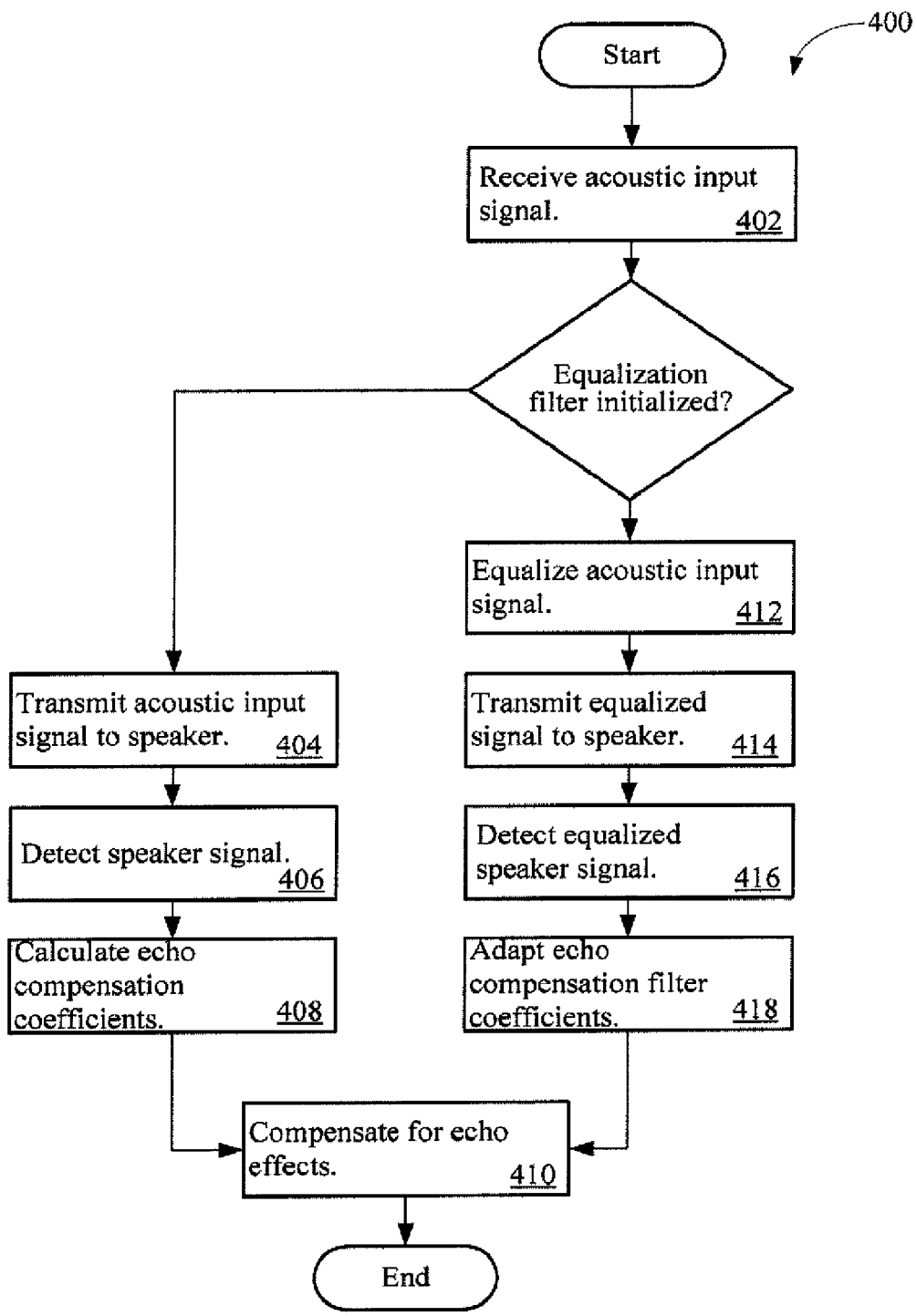
FIG. 4 is a second exemplary process by which an acoustic signal may be equalized.

FIG. 4 is a second exemplary process 400 by which an acoustic input signal may be equalized. The process 400 receives the acoustic input signal (Act 402). The process 400 determines whether an equalization filter has been initialized. The process 400 may determine that the equalization filter has not been initialized if the acoustic input signal is a first acoustic input signal received as part of t for example, a telephone conversation. The process 400 may initialize the equalization filter at the beginning of a telephone conversation. If the equalization filter has not been initialized, the process 400 may transmit the acoustic input signal to a speaker that generates a speaker signal based on the acoustic input signal (Act 404). The process 400 may detect the speaker signal using, for example, a microphone (Act 406). The process 400 may receive a microphone signal generated by the microphone based on the detected speaker signal. The process 400 may determine echo compensation filter coefficients based on the microphone signal (Act 408). Based on the echo compensation filter coefficients, the process 400 may compensate for any undesirable echo effects in the microphone signal (Act 410).

If the equalization filter has been initialized, the process 400 equalizes the acoustic input signal (Act 412). The process 400 transmits the equalized acoustic input signal to the speaker, which may generate an equalized speaker signal based on the equalized acoustic input signal (Act 414). The process 400 may detect the equalized speaker signal using the microphone (Act 416). The process 400 may receive the microphone signal generated by the microphone based on the detected equalized speaker signal. The process 400 may generate the echo compensation signal based on the microphone signal (Act 418). Generating the echo compensation signal based on the microphone signal may include dynamically adapting the echo compensation filter coefficients of the echo compensation filter. Based on the adapted echo compensation filter coefficients, the process may compensate for some or all echo effects in the microphone signal.

It will be understood that if the process 400 receives an acoustic input signal and the equalization filter has not initialized, the process 400 may use the acoustic input signal to initialize the equalization filter according to Acts 404-408. The equalization filter may be initialized to a default value. For example, at the beginning of a telephone call between a remote party and a local party, the equalization filter may be initialized by $h_C(n)=[1, 0, \ldots, 0]^T$. Amplification and/or damping caused by the equalization filter may be modified through modification of the first coefficient of the vector r(n).

Figure 5:
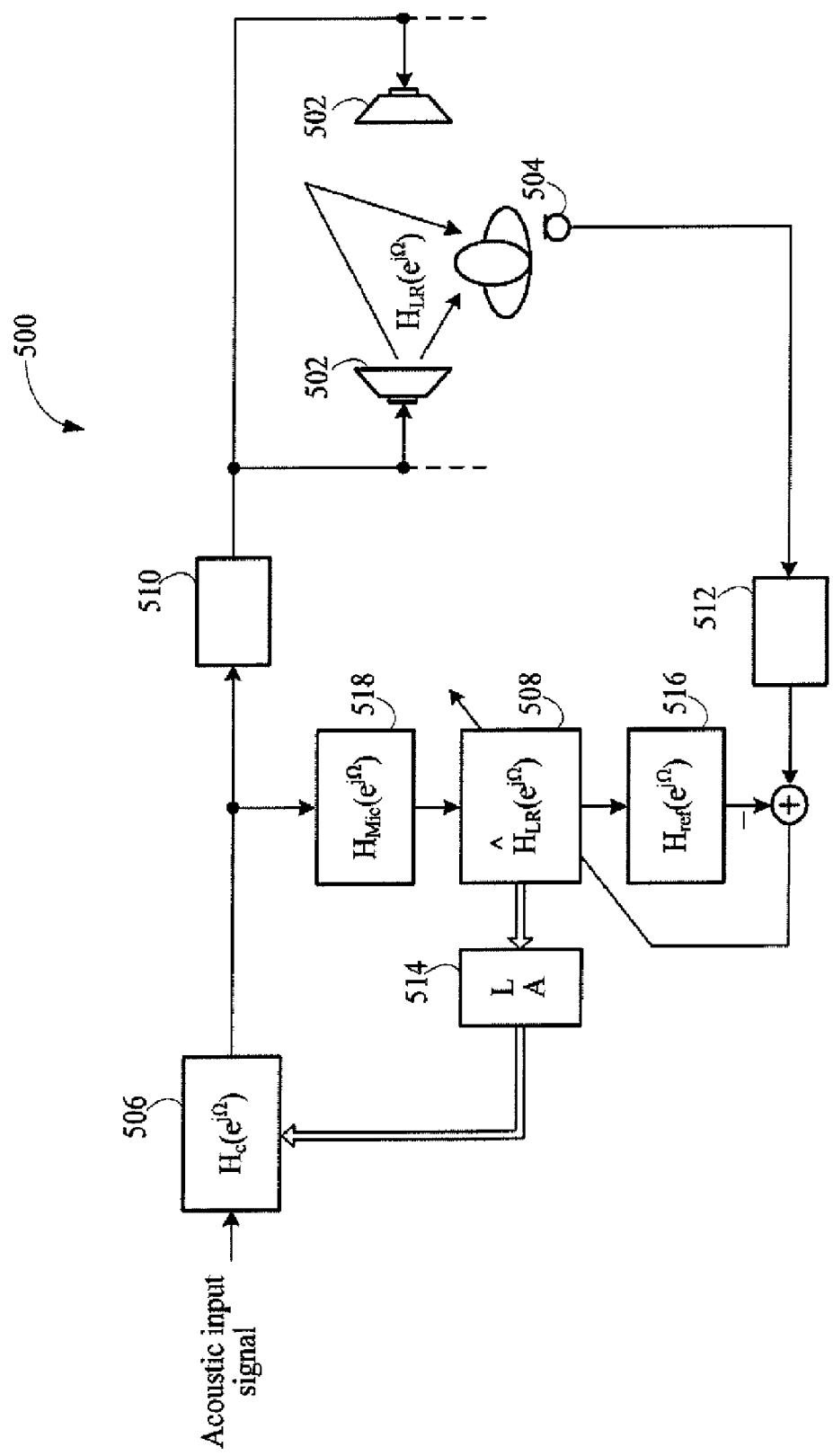
FIG. 5 is a second exemplary system for equalizing an acoustic signal.

FIG. 5 is a second exemplary system 500 for equalizing an acoustic signal. In this example, the system 500 is installed in a passenger compartment of a vehicle that includes speakers 502 and at least one microphone 504. The system 500 comprises an equalization filter 506 and an echo compensation filter 508. The equalization filter 506 is configured to equalize a signal received from a remote party.

The echo compensation filter 508 may be an adaptive filter. For example, the echo compensation filter 508 coefficients may be dynamically adjusted and may not be time-independent. Adjustment of the filter coefficients may be performed every sampling time. Adjustment may also be performed less often than every sampling time, such as a few times per second.

The echo compensation filter 508 may be an adaptive finite impulse response (FIR filter). The echo compensation filter 508 may comprise other filter types, such as an infinite impulse response filter (IIR filter). The filter coefficients of the echo compensation filter 508 may be adapted by a normalized least means square (NLMS) method or other adaptive method.

The echo compensation filter 508 may include an LPC filter or other predictive pre-filter. The predictive pre-filter may determine an FIR or other adaptive filter that may optimally predict future samples of an underlying autoregressive process based on a linear combination of past samples. The speaker-room-listener transfer function may be represented by $H_{LR}e^{(j\Omega)}$.

A speaker amplifier 510 may be connected upstream of the speakers 502. A microphone amplifier 512 may connected downstream of the microphone 504. The amplifiers 510, 512 may facilitate A/D and D/A processing. The amplifiers 510, 512 may also be controllable by a user for further adjusting the intelligibility of a communications between a remote party and a local party.

The equalization filter coefficients of the equalization filter 506 are calculated based on the echo compensation filter coefficients of the echo compensation filter 508. A linear algebra unit 514 coupled between the echo compensation filter 508 and the equalization filter 506 may calculate the equalization filter coefficients by solving a linear system using a recursive method, such as the Levinson-Durbin method. The linear algebra unit 514 may be a part of or separate from the equalization filter 506 or the echo compensation filter 508. The linear system includes the equalization filter coefficients that are to be determined and the echo compensation filter coefficients.

The system may also comprise a reference filter 516 to provide a desired reference frequency response $H_{ref}(e^{j\Omega})$ of the total transfer from the input signal to a signal detected close to the ears of a listener, i.e. close to the microphone 504. The reference filter 516 may comprise reference filter coefficients that represent a predetermined reference frequency response, where the echo compensation filter coefficients, and thus the equalization filter coefficients, are determined based on the reference filter coefficients. The reference filter 516 may be an FR or IIR filter. For example, in a system that may experience a smaller demand on computing resources, an IIR filter may be used in place of an FIR for the same or substantially the same transfer function.

The equalization filter 506 may accordingly be configured to boost or attenuate frequency ranges in accordance with the reference filter coefficients that model a desired pre-determined frequency response. The equalization filter coefficients may be determined in order to approximate the reference frequency response by $H_C(e^{j\Omega})H_{LR}(e^{j\Omega}) \approx H_{ref}(e^{j\Omega})$, where $H_C(e^{j\Omega})$ denotes the frequency response of the equalization filter 506. If the microphone 504, or microphones where multiple microphones are used, are located at some relatively large distance from the listener's/speaker's ear, the difference between the transfer function in the case of a microphone 504 near the ear and the case in which the microphone 504 and listener are spaced apart may be determined and the reference transfer function may be appropriately be adapted for large differences.

The output of the equalization filter 506 may be provided to a fixed pre-filter 518 used to model the transfer function $H_{Mic}(e^{j\Omega})$ of the microphone 504. The fixed pre-filter 518 may comprise filter coefficients determined to model the transfer function of the microphone 504. The fixed pre-filter 518 may provide the echo compensation filter 508 with a signal based on the equalized acoustic input signal and the transfer function of the microphone 504 to provide for proper correction of the frequency response of the microphone 504. If the microphone 504 is a directional microphone, the filter coefficients of the fixed pre-filter 518 may be calculated to model the transfer function of the directional microphone in direction of a speaker that is located closer to the directional microphone than any of the other speakers.

Figure 6:
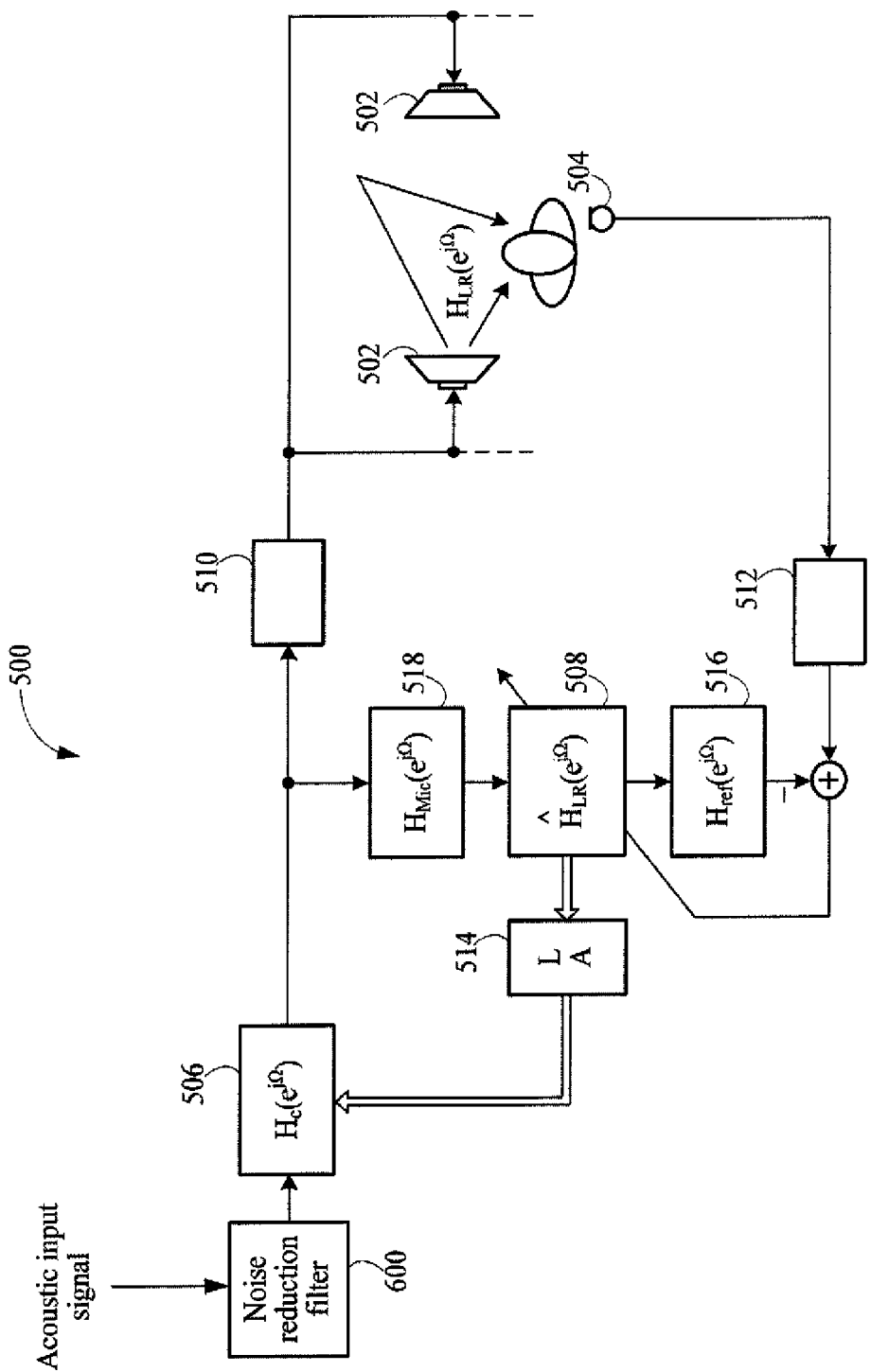
FIG. 6 is the system of FIG. 5 including noise reduction.

FIG. 6 is the system of FIG. 5 including a noise reduction filter. The system 500 may include one or more noise reduction filters 600 coupled to the equalization filter 506. The noise reduction filter 600 may be an adaptive or non-adaptive filter. The acoustic input signal received from the remote party may be processed for noise reduction by the noise reduction filter before equalization.

The system 500 may also include noise reduction filters at other locations. For example, a noise reduction filter may be in communication with the output of the equalization filter 506 to reduce noise present in the equalized acoustic input signal.

Figure 7:
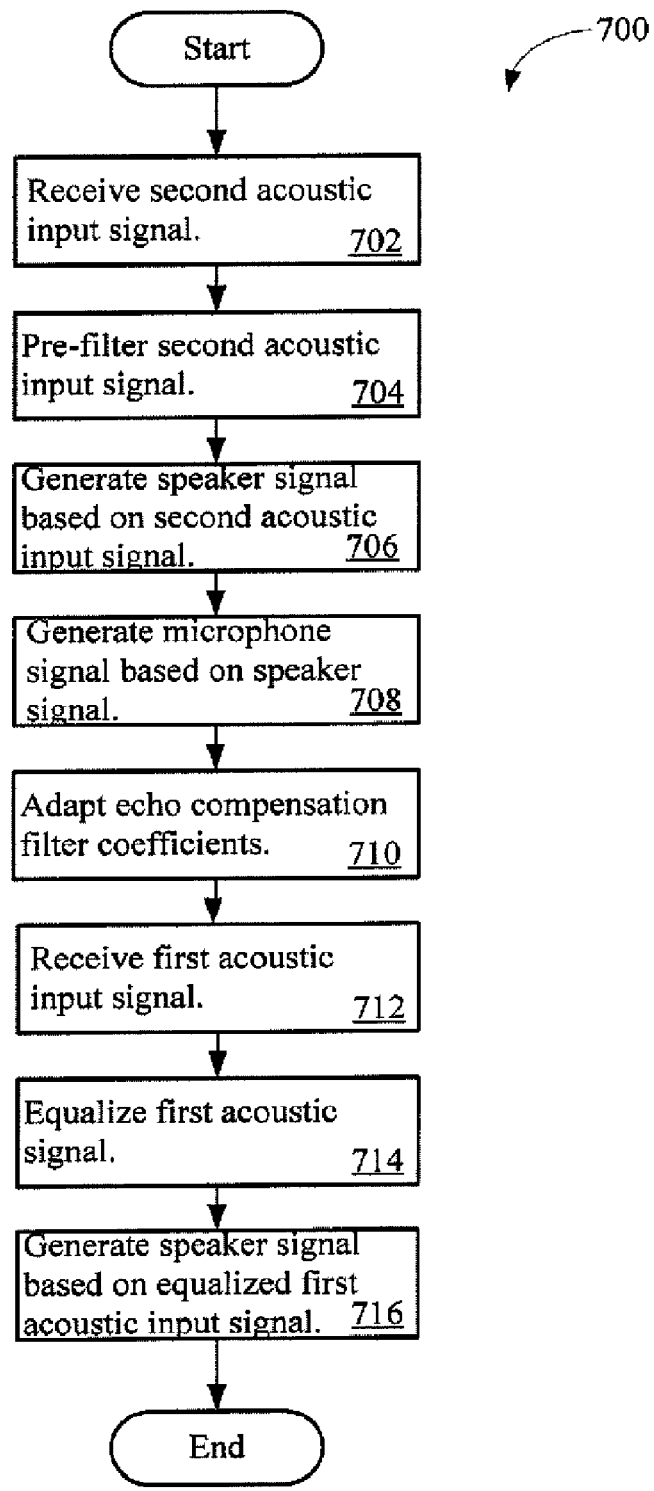
FIG. 7 is an exemplary process for enhancing the quality of a first acoustic input signal.

FIG. 7 is an exemplary process 700 for enhancing the quality of a first acoustic input signal. The second acoustic input signal may be a signal received from a remote party before the first acoustic input signal. In particular, the second acoustic input signal may be a signal received immediately before the first acoustic input signal. The process 700 receives the second acoustic input signal (Act 702). The process 700 may utilize a microphone to receive the second acoustic input signal.

The process 700 may pre-filter the second acoustic input signal (Act 704). The process 700 may apply the second acoustic input signal to a pre-filter that models the transfer function of the microphone to generate a pre-filtered signal. If the microphone is a directional microphone, the pre-filter may model the transfer function of the directional microphone in direction of a speaker that is located closer to the directional microphone than any other speakers. The echo compensation filter may be adapted based on the pre-filtered signal to substantially prevent undesired correction of the frequency response of the microphone.

The process 700 may generate a speaker signal based on the second acoustic input signal (Act 706). The second acoustic input signal may be transmitted to a speaker that generates the speaker signal based on the second acoustic input signal. The process 700 may generate a microphone signal based on the speaker signal (Act 708).

The process 700 may adapt echo compensation filter coefficients of the echo compensation filter based on the pre-filtered signal and the microphone signal (Act 710). The process 700 may provide a fixed pre-determined reference frequency response where the echo compensation filter coefficients are determined on the basis of the pre-determined reference frequency. The pre-determined reference response that characterizes the desired acoustic signal output by the speaker may be provided by a reference filter. The reference filter may include filter coefficients that model the desired frequency response.

The process 700 may adapt the filter coefficients of the echo compensation filter on the basis of a beamformed microphone signal, if directional microphones are employed. The echo compensation of the microphone signal may comprise LPC filtering.

The echo compensating process for reducing the echo effects may be carried out by an adaptive echo compensation filter, such as an adaptive FIR filter. The FIR filter may be dynamically adapted, such as a few times per second, by an NLMS method. Both the microphone and the speaker signals may be amplified. In addition, the echo compensation may be accompanied by predictive pre-filtering for increasing the convergence speed of the calculation procedure for the filter coefficients of the echo compensation filter.

The process 700 may receive the first acoustic input signal (Act 712). The process equalizes the first acoustic input signal (Act 714). The process 700 carries out equalization of the first acoustic input signal based on the filter coefficients of the echo compensation filter. The quality of the first acoustic input signal is accordingly significantly enhanced. The process may generate a speaker signal based on the equalized first acoustic input signal to make the first acoustic input signal available to be heard by a local party (Act 716). The process 700 may filter of the equalized first and/or second acoustic input signals to reduce noise. The process 700 may be implemented in a hands-free set, and in particular, in a hands-free set installed in a vehicle.

Figure 8:
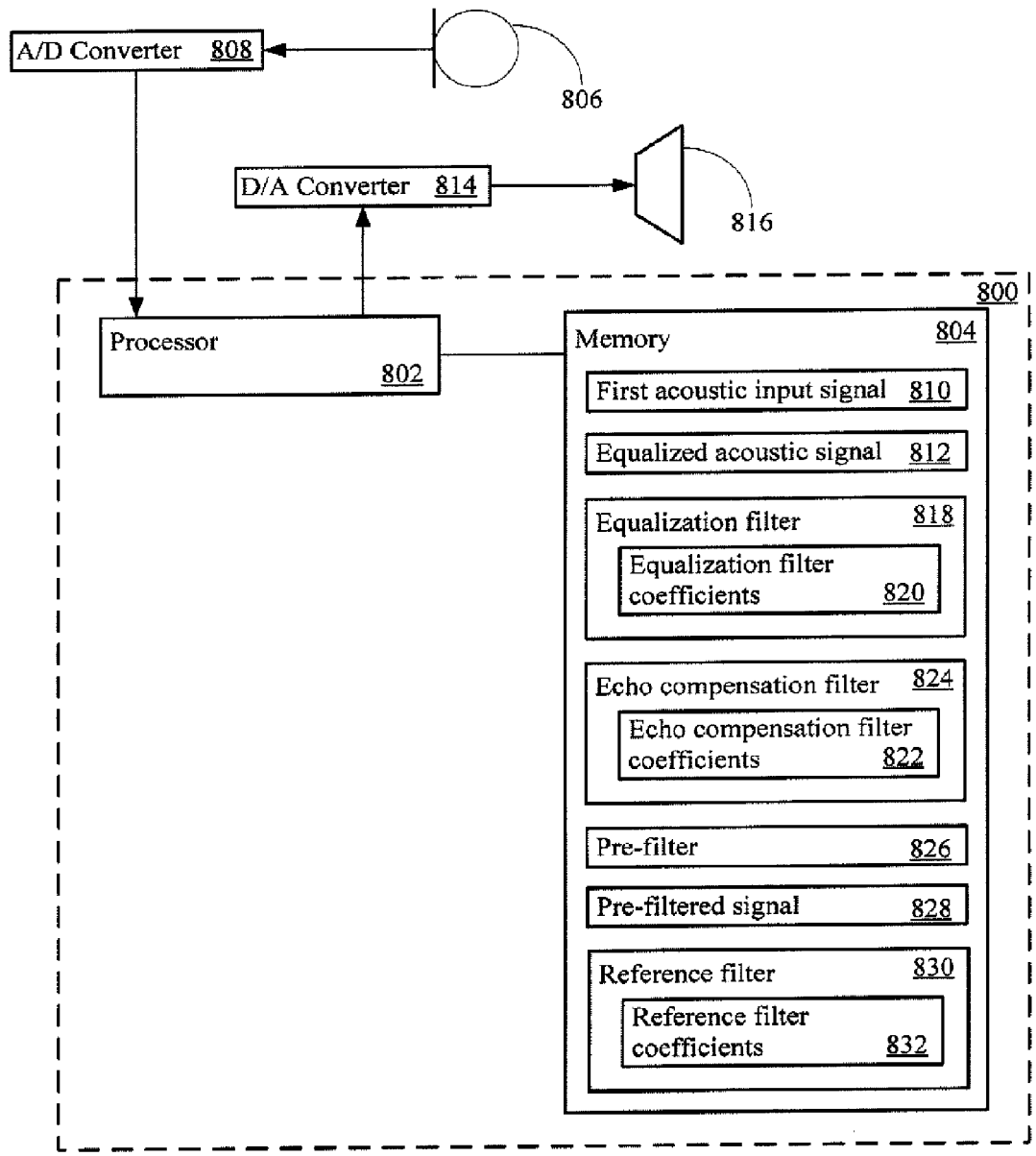
FIG. 8 is a third exemplary equalization system.

FIG. 8 is a third exemplary equalization system 800. The equalization system 800 includes a processor 802 and a memory 804. A sound detection device 806, such as a microphone, converts sound waves into a signal. An A/D converter 808 may process the signal. The A/D converter converts the signal to a digital format. The processor 802 in FIG. 8 receives the digital signal as an acoustic input signal 810 from the A/D converter 808.

The processor may execute instructions stored in the memory 804 to control operation of the equalization system 800 and to produce a high quality and intelligible equalized acoustic signal 812. The equalized acoustic signal 812 may be produced in a digital format. A D/A converter 814 may process the equalized acoustic signal 812 and convert the equalized acoustic signal 812 to, for example, an analog format. A sound emitting device 816, such as a speaker, may receive the analog signal and convert the analog signal into sound waves based on the equalized acoustic signal 812.

Although selected aspects, features, or components of the implementations are depicted as being stored the memory 804, all or part of the systems, including the methods and/or instructions for performing such methods consistent with the equalization system 800, may be stored on, distributed across, or read from other computer-readable media, for example, secondary storage devices such as hard disks, floppy disks, and CD-ROMs; a signal received from a network; or other forms of ROM or RAM either currently known or later developed.

Specific components of the equalization system 800 may include additional or different components. The processor 802 may be implemented as a microprocessor, microcontroller, application specific integrated circuit (ASIC), discrete logic, or a combination of other types of circuits or logic. Similarly, the memory 804 may be DRAM, SRAM, Flash, or any other type of memory. Parameters (e.g., data associated with wavelet levels), databases, and other data structures may be separately stored and managed, may be incorporated into a single memory or database, or may be logically and physically organized in many different ways. Programs, processes, and instruction sets may be parts of a single program, separate programs, or distributed across several memories and processors.

The memory 804 may store the acoustic input signal 810 and the equalized acoustic signal 812. The equalization system 100 may apply the acoustic input signal 810 to an equalization filter 818. The equalization filter 818 may be programmed into software stored in the memory 804. In another system, the equalization filter 818 may be implemented in hardware. The equalization filter 818 includes adaptable equalization filter coefficients 820 that may be stored in the memory 804. The equalization filter 818 equalizes the acoustic input signal 810 and produces the equalized acoustic signal 812.

The equalization filter coefficients 820 are determined based on echo compensation filter coefficients 822 of an echo compensation filter 824. The echo compensation filter 824 may be programmed into software stored in the memory 804, or may be implemented in hardware. The echo compensation filter 824 reduces echo effects of signals detected by and received from the sound detection device 806. The echo compensation filter coefficients 822 may also be adaptable filter coefficients.

The echo compensation filter coefficients 822 may be adjusted each sampling time. The echo compensation filter coefficients 822 may also be adjusted less frequently than each sampling time. The echo compensation filter 824 may be an FIR filter configured for adaptation by an NLMS method.

A pre-filter 826 may also be programmed into software stored in the memory 804. The pre-filter 826 may model the transfer function of the sound detection device 806. The pre-filter 826 may produce a pre-filtered signal 828 that is stored in the memory 804. The equalization system 800 may use the pre-filtered signal 828 to adapt the echo compensation filter 824 to substantially avoid undesired correction of the frequency response of the sound detection device 806.

A reference filter 830 may also be programmed into software stored in the memory 804. The reference filter 830 may include reference filter coefficients 832 that model a pre-determined reference frequency response. The pre-determined reference frequency response may characterize a desired acoustic signal output by the sound emitting device 816. The equalization system 800 may use the reference filter coefficients 832 to determine the echo compensation filter coefficients 822 and the equalization filter coefficients 820. The reference filter 830 and the pre-filter 826 may alternatively be implemented in hardware.

The equalization system 800 may be implemented in a communication system to enhance the quality of audio communications received from remote parties and heard by local parties. The communication system may be a hands-free communication system, such as a hands-free communication system installed in a vehicle.

The methods, processes, programs, and/or instructions may be encoded in a signal bearing medium, a computer readable medium such as a memory, programmed within a device such as on one or more integrated circuits, or processed by a controller or a computer. If the methods are performed by software, the software may reside in a memory resident to or interfaced to a communication interface, or any other type of non-volatile or volatile memory. The memory may include an ordered listing of executable instructions for implementing logical functions. A logical function may be implemented through digital circuitry, through source code, through analog circuitry, or through an analog source such through an analog electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine-readable medium," "propagated-signal" medium, and/or "signal-bearing medium" may comprise any means that contains, stores, communicates, propagates, or transports software for use by or in connection with an instruction executable system, apparatus, or device. The computer-readable medium may selectively be, but not limited to, an electronic, magnetic, optical, electromagnetic, infrared, or semiconductor system, apparatus, device, or propagation medium. A non-exhaustive list of examples of a computer-readable medium may include: an electrical connection "electronic" having one or more wires, a portable magnetic or optical disk, a volatile memory such as a Random Access Memory "RAM" (electronic), a Read-Only Memory "ROM" (electronic), an Erasable Programmable Read-Only Memory (EPROM or Flash memory) (electronic), or an optical fiber (optical). A computer-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A system for equalizing an acoustic input signal, comprising
   an echo compensation filter configured to receive a microphone signal from a microphone, the echo compensation filter comprising multiple echo compensation filter coefficients determined on the basis of the microphone signal;
   an equalization filter in communication with the echo compensation filter, the equalization filter configured to equalize the acoustic input signal, where the equalization filter comprises multiple equalization filter coefficients determined based on the echo compensation filter coefficients; and
   a reference filter comprising reference filter coefficients that represent a predetermined reference frequency response of the system including the echo compensation fiter and the equalization filter, where the echo compensation filter coefficients are determined based on the reference filter coefficients.

2. The system of claim 1, where the equalization filter is configured to transmit the equalized acoustic input signal to a speaker, and where the microphone signal is generated based on a speaker signal output by the speaker and detected by the microphone.

3. The system of the claim 2, further comprising a speaker amplifier in communication with the speaker and a microphone amplifier in communication with the microphone.

4. The system of claim 3, where at least one of the speaker amplifier and microphone amplifier are configured to be controlled by a user.

5. The system of claim 1, where the echo compensation filter is an adaptive filter.

6. The system of claim 5, where the echo compensation filter comprises a predictive pre-filter.

7. The system of claim 5, where the adaptive filter is an FIR filter.

8. The system of claim 7, where the FIR filter is adapted by a normalized least means square method.

9. The system of claim 1, further comprising a pre-filter, the pre-filter comprising:
   filter coefficients determined for modeling a transfer function of the microphone;
   and
   where the pre-filter is configured to:
      receive the equalized acoustic input signal;

generate a pre-filter signal based on the equalized acoustic input signal and on the transfer function of the microphone; and transmit the pre-filter signal to the echo compensation filter.

10. The system of claim 9, where the microphone is a directional microphone located in an enclosure, and where the filter coefficients of the pre-filter are determined for modeling the transfer function of the directional microphone in a direction of a speaker that is located closer to the directional microphone than other speakers in the enclosure.

11. The system of claim 1, where the equalization filter coefficients are determined based on the echo compensation filter coefficients by solving a linear equation system with a recursive method.

12. The system of claim 1, further comprising a noise reduction filter configured to reduce noise of at least one of the acoustic input signal and the equalized acoustic input signal.

13. The system of claim 1, where the microphone signal received by the echo compensation filter is received from a microphone installed in a vehicle.

14. A method for enhancing the quality of a first acoustic input signal, comprising:
generating a speaker signal based on a second acoustic input signal by a speaker;
detecting the speaker signal;
generating a microphone signal based on the detected speaker signal;
adapting filter coefficients of an echo compensation filter to echo compensate the microphone signal;
providing a pre-determined reference frequency response approximately representative of the echo compensation filter and an equalization filter, where the filter coefficients of the echo compensation filter are determined based on the pre-determined reference frequency response; and
equalizing the first acoustic input signal with an equalization filter comprising equalization filter coefficients, where the equalization filter coefficients are determined based on the filter coefficients of the echo compensation filter.

15. The method of claim 14, further comprising:
pre-filtering the second acoustic input signal using of a pre-filter that models the transfer function of a microphone to generate a pre-filtered signal, where the filter coefficients of the echo compensation filter are adapted based on the pre-filtered signal.

16. The method of claim 15, where the microphone is a directional microphone located in an enclosure and where the pre-filter models the transfer function of the directional microphone in a direction of a speaker that is located closer to the directional microphone than other speakers located in the enclosure.

17. The method of claim 14, where equalizing comprises solving the linear algebraic equation system:

$$\begin{bmatrix} r_0(n) & r_1(n) & \cdots & r_{N_C-1}(n) \\ r_1(n) & r_0(n) & \cdots & r_{N_C-2}(n) \\ \vdots & \vdots & \ddots & \vdots \\ r_{N_C-1}(n) & r_{N_C-2}(n) & \cdots & r_0(n) \end{bmatrix} \begin{bmatrix} h_{C,0}(n) \\ h_{C,1}(n) \\ \vdots \\ h_{C,N_c-1}(n) \end{bmatrix} = \begin{bmatrix} r_1(n) \\ r_2(n) \\ \vdots \\ r_{N_C}(n) \end{bmatrix}$$

$$r_i(n) = \frac{1}{N-1} \sum_{k=0}^{N-i-1} \hat{h}_{LR,k}(n)\hat{h}_{LR,k+i}(n)$$

where the coefficients $r_i(n)$ are given by where n is a discrete time index and $\hat{h}_{LR,k}(n)$ and $h_{C,i}(n)$ are filter coefficients of the echo compensation filter and N filter coefficients of an equalization filter are used for equalizing the first acoustic input signal.

18. The method of claim 17, where the linear algebraic equation system is solved using a recursive method.

19. A product comprising:
a tangible computer readable medium; and
programmable instructions stored on the computer readable medium that cause a processor in an equalization system to:
generate a speaker signal based on a first acoustic input signal;
detect the speaker signal;
generate a microphone signal based on the detected speaker signal; adapt filter coefficients of an echo compensation filter to echo compensate the microphone signal; and
equalize a second acoustic input signal with an equalization filter comprising equalization filter coefficients, where the equalization filter coefficients are determined based one the filter coefficients of the echo compensation filter
wherein a reference filter is provided having reference filter coefficients that represent a predetermined reference frequency response of the system including the echo compensation filter and the equalization filter, where the echo compensation filter coefficients are determined based on the reference filter coefficients.

20. The product of claim 19, where the programmable instructions stored on the computer readable medium cause the processor to:
pre-filter the first acoustic input signal using a pre-filter that models the transfer
function of a microphone; and
generate a pre-filtered signal, where the filter coefficients of the echo compensation filter are adapted based on the pre-filtered signal.

21. The product of claim 19, where the pre-determined reference frequency is modeled by multiple reference filter coefficients of a reference filter.

22. The product of claim 19, where the number of equalization filter coefficients is less than the number of filter coefficients of the echo compensation filter.

23. The product of claim 19, where the programmable instructions stored on the computer readable medium cause the processor to generate a speaker signal based on the equalized second acoustic input signal.

24. The product of claim 19, where echo compensation filter comprises a predictive pre-filter.

25. The product of claim 24, where the predictive pre-filter is a linear prediction coding filter.

26. The product of claim 19, where the computer readable medium is implemented in a vehicle to provide hands-free communication between a passenger of the vehicle and a remote party.

* * * * *

UNITED STATES PATENT AND TRADEMARK OFFICE
CERTIFICATE OF CORRECTION

PATENT NO. : 8,098,848 B2
APPLICATION NO. : 11/749678
DATED : January 17, 2012
INVENTOR(S) : Tim Haulick, Gerhard Uwe Schmidt and Markus Buck It is certified that error appears in the above-identified patent and that said Letters Patent is hereby corrected as shown below:

In Col. 12, Lines 1-6 replace

" $r_i(n) = \frac{1}{N-1} \sum_{k=0}^{N-i-1} \hat{h}_{LR,k}(n)\hat{h}_{LR,k+i}(n)$ where the coefficients $r_i(n)$ are given by where n is a dis-"

with

"where the coefficients $r_i(n)$ are given by $r_i(n) = \frac{1}{N-1} \sum_{k=0}^{N-i-1} \hat{h}_{LR,k}(n)\hat{h}_{LR,k+1}(n)$ where n is a dis-"

Signed and Sealed this
First Day of May, 2012

David J. Kappos
*Director of the United States Patent and Trademark Office*